US008622278B1

(12) United States Patent
Alvarez et al.

(10) Patent No.: US 8,622,278 B1
(45) Date of Patent: Jan. 7, 2014

(54) SOCKET COVER WITH HEAT FLOW FOR SURFACE MOUNT SOLDER REFLOW

(75) Inventors: Victor Alvarez, Hillsboro, OR (US); Scott K. Buttars, Aloha, OR (US); Steven R. Vandervoort, Beaverton, OR (US); Shijiang He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/539,246

(22) Filed: Jun. 29, 2012

(51) Int. Cl.

| | |
|---|---|
| ***B23K 37/04*** | (2006.01) |
| ***B23K 5/22*** | (2006.01) |
| ***H01R 13/62*** | (2006.01) |
| ***H01R 13/44*** | (2006.01) |

(52) U.S. Cl.
USPC ........... 228/49.5; 228/212; 439/331; 439/135

(58) Field of Classification Search
USPC ......... 228/49.5, 212, 213, 214, 222; 439/331, 439/135
See application file for complete search history.

(56) References Cited

U.S. PATENT DOCUMENTS

| | | | | |
|---|---|---|---|---|
| 4,962,878 | A * | 10/1990 | Kent | 228/49.5 |
| 5,485,037 | A * | 1/1996 | Marrs | 257/712 |
| 5,614,694 | A * | 3/1997 | Gorenz et al. | 174/375 |
| 6,413,111 | B1 * | 7/2002 | Pickles et al. | 439/342 |
| 6,504,095 | B1 * | 1/2003 | Hoffstrom | 174/520 |
| 6,552,261 | B2 * | 4/2003 | Shlahtichman et al. | 174/384 |
| 6,781,851 | B2 * | 8/2004 | Daoud et al. | 361/818 |
| 6,949,706 | B2 * | 9/2005 | West | 174/384 |
| 6,974,331 | B2 * | 12/2005 | Brown et al. | 439/66 |
| 6,979,773 | B2 * | 12/2005 | Fursich | 174/377 |
| 7,014,488 | B2 * | 3/2006 | Stone | 439/331 |
| 7,083,456 | B2 * | 8/2006 | Trout et al. | 439/326 |
| 7,623,360 | B2 * | 11/2009 | English et al. | 361/816 |
| 7,787,250 | B2 * | 8/2010 | Li et al. | 361/715 |
| 7,926,166 | B2 * | 4/2011 | Zuehlsdorf et al. | 29/602.1 |
| 7,965,514 | B2 * | 6/2011 | Hill et al. | 361/707 |
| 2005/0218035 | A1 * | 10/2005 | Pearson et al. | 206/723 |
| 2012/0044663 | A1 * | 2/2012 | Lu et al. | 361/818 |

* cited by examiner

*Primary Examiner* — Kiley Stoner
*Assistant Examiner* — Carlos Gamino
(74) *Attorney, Agent, or Firm* — Blakely, Sokoloff, Taylor & Zafman LLP

(57) ABSTRACT

A cover for a socket that is to be soldered to a printed circuit board is described. The socket has connections to be soldered to the printed circuit board and connections to contact a die that will be carried by the socket. The socket includes a top surface to cover the die contacts of the socket and side walls surrounding the top surface and extending toward the socket to separate the top surface from the die contacts. The top surface has a plurality of inlet vents, and the side walls have a plurality of outlet vents.

17 Claims, 5 Drawing Sheets

SOCKET COVER WITH HEAT FLOW FOR SURFACE MOUNT SOLDER REFLOW

BACKGROUND

Modern printed circuit boards (PCB) used in Server, Desktop and Mobile computers, among others, use surface mount technology (SMT) reflow ovens to solder a large variety of different electronic components to the PCBs. In the SMT process, Solder paste is applied to the PCB, for example, with a Stencil or an ink jet type machine. The solder paste contains chemical fluxes to remove metallic oxides from the surfaces being soldered. The components are then placed on the PCB over the paste using, for example, a pick and place machine (PnP), and the assembly is drawn through the SMT reflow oven on a conveyor. In order to generate uniform, metallurgical and mechanically sound solder joints, SMT ovens use temperature zones to heat the board, the components and the solder paste, in a closely controlled temperature profile.

LGA (Land Grid Array) sockets, like other large sockets, are particularly challenging to solder, because they have many solder joints spread over a relatively large area. It is difficult to heat the large area evenly. The outer solder joints reach proper reflow temperatures more quickly than the inner solder joints. The inner solder joints reach reflow temperature later because of poor thermal transfer through the PCB and the socket. This comes in part because of the large distance between edges where heat can enter between the PCB and the socket to reach the solder balls. In addition, temperature differentials across the LGA socket during the SMT process cause the socket to deform (warp). The deformed socket does not lay flat against the PCB causing uneven and incomplete solder joint formation.

During solder reflow, covers are placed on the sockets to protect the sockets and to provide a surface by which the pick and place machine can grasp and hold the socket. These socket covers may include vents on the top to allow air flow to the socket. The air flow allows the top surface of the socket to be heated which, in turn, heats the connections to the solder balls.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
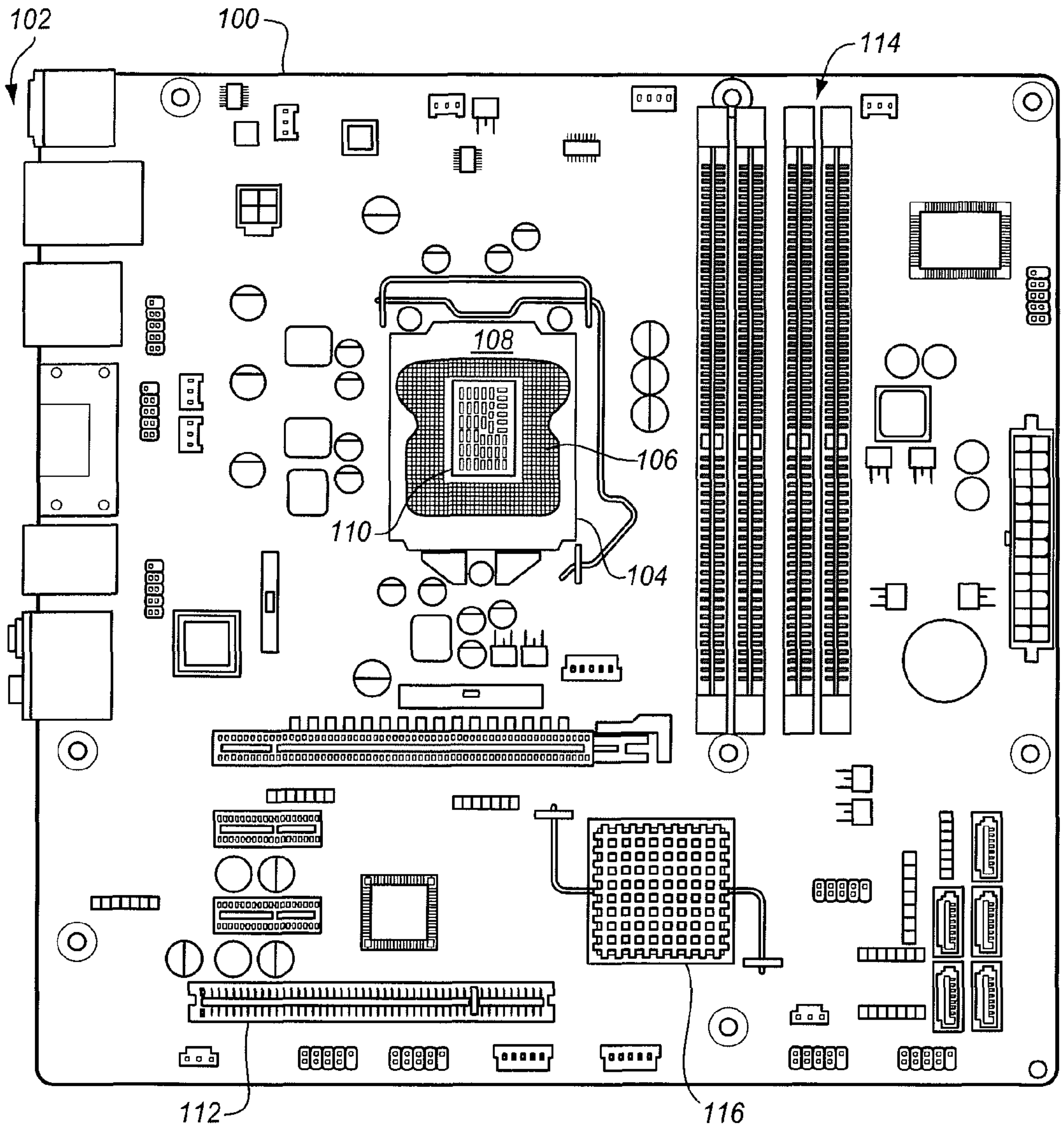
FIG. 1 is top elevation view of a computer motherboard with a mounted socket which may be made according to embodiments of the present invention.

Previous socket cover designs include vents, on a horizontal plane. The vents are away from the center of the component in order to allow space for a vacuum tool of a pick and place machine to grasp the socket using the cover. The vents restrict air flow and heat transfer efficiency. As a result, the conveyor speed in the SMT reflow oven must be slowed to allow colder areas near the middle of the socket to reach the solder reflow or melting temperature. The slower soldering process reduces the number of boards that can be soldered and causes the active ingredients in the solder paste flux present in the hotter areas of the socket to be exhausted by evaporation. This can lead to head-on-pillow solder joint defects reducing quality and reliability.

On the other hand, if the socket cover is removed for the SMT reflow oven, then the flux is also degraded, leading to other soldering defects. Exposing the top and the bottom of the board and socket to direct air flow greatly reduces the solder reflow time, but also causes increased flux degradation. The increased flux degradation overwhelms the benefits of more even heating and reduced time delays provided by removing the cover.

Removing the covers is too extreme and speeds the flux degradation because of faster direct air flow movement through the exposed contact field. The heat flow is so fast that reliable results cannot be obtained. On the other hand, with vented caps, the flux dries out faster but not as fast. The closed nature of the socket with a cover minimizes flux drying just enough to provide reliable, repeatable results. The vented cover helps create even heat distribution across the socket. Too much venting in a cover can prematurely deplete the active ingredients in the flux in the paste. Optimizing the cover venting creates increased heat in the middle and reduces air flow by an appropriate amount.

By providing an improved airflow through the cover, temperatures across the socket can be made more uniform, providing for more uniform solder joint forming conditions. This helps to prevent Surface Mount Technology (SMT) assembly process defects, such as cold solder joints, head-on-pillow defects, elongated joints, etc. that result in, yield losses, risk to product reliability, and reduced assembly throughput.

The described vent geometry provides optimized heated air inlet and exhaust pathways, which promote faster and more uniform heat transfer, while minimizing solder flux degradation. This results in larger process windows for the varied processing environments. While the present description is presented in terms of air flow and air vents, some reflow furnaces use a different heat transfer medium. The described devices and techniques can also be used with other heat transfer media, such as inert gasses like $N_2$.

The described approach uses a socket cover with an inlet and outlet or exhaust vent pattern geometry that is optimized for rapid and uniform heat transfer. The vents reduce temperature differentials across the LGA socket, avoiding excessive solder paste flux degradation. At the same time, the socket cover may be designed to meet all other design and process requirements such as PnP "keep out zone" (KOZ) areas, maximum height limits, retaining force on the socket for rework, and ergonomic requirements for manual removal.

In some embodiments, the unique vent pattern is easily identified because the vents that serve predominantly as inlets are arranged in a circle, on a horizontal planar raised area around the PnP's "keep out zone" (at the center of the component). The vents that serve predominantly as exhaust vents are located on vertical-side walls that support the raised area.

LGA (Land Grid Array) sockets are particularly challenging to solder, because many solder joints, spread over a relatively large area, are difficult to heat evenly. Temperature differentials ($\Delta T$) across the LGA socket during the SMT process cause it to deform (warp), and cause uneven and incomplete solder joint formation. This invention provides uniform temperatures across the socket, without degrading the solder flux, providing uniform solder joint forming conditions. The optimized vent geometry provides the heated air inlet and exhaust pathways, which promote faster and more uniform heat transfer, resulting in larger process windows for the varied processing environments in Original Design and Manufacturer (ODM's) throughout the world.

FIG. 1 shows a motherboard 100 suitable for use with the present invention. The motherboard includes a CPU socket 104 with a clamp 108 to hold a CPU in place. The socket has an array of land grid connection pads 106 and a central opening 110. A collection of capacitors and other discrete devices can be seen mounted to the motherboard 100 through a central opening 110 in the middle of the socket.

The motherboard also includes input/output connectors 102, a set of adapter card slots 112 to receive adapter cards on PCI (Peripheral Component Interconnect) and related interfaces and a set of sockets 114 for adding random access memory. A chip set 116 resides also on the motherboard to connect the CPU (not shown) to peripheral devices. The chip set 116 may be soldered to the board in the reflow oven at the same time as the socket. The many components shown on this example desktop computer motherboard are all attached or mostly attached using an SMT reflow oven. The same principles apply to server, notebook, ultrabook, nettop, set top and motherboards for many other types of computing systems.

Figure 2:
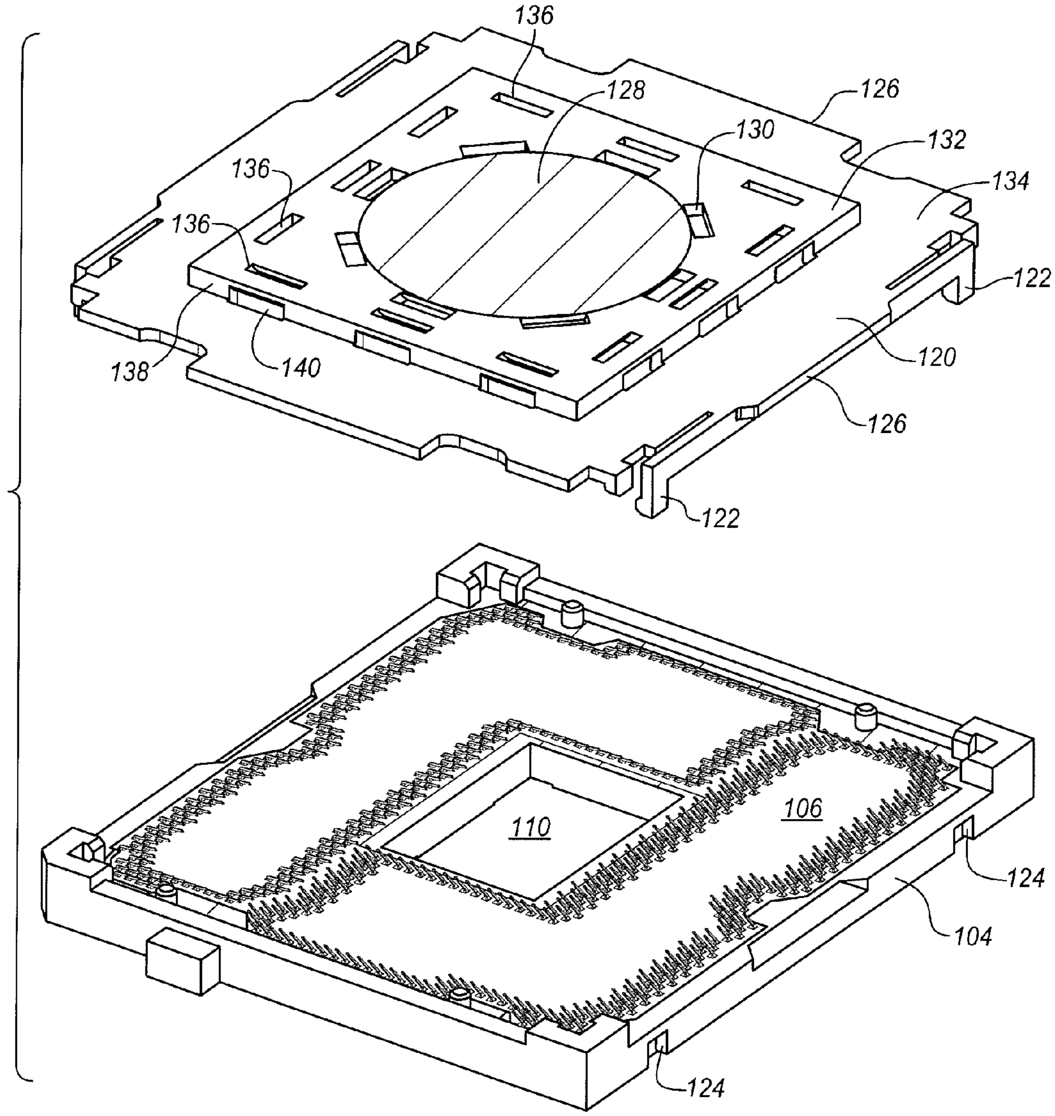
FIG. 2 is a perspective view of a socket and a cover according to an embodiment of the invention.

FIG. 2 shows the socket 104 in more detail. In the example of FIG. 2 the clamp is not attached to the socket. In a typical assembly process, the socket is first soldered to the motherboard and the clamp 108 is attached afterward. As mentioned above, the socket 104 has a land grid array (LGA) 106 that surrounds a central opening 110. When the socket is attached to the motherboard 100 the motherboard is exposed through the central opening. A socket cover 120 is designed to latch in place on top of the socket 104.

In the illustrated example, flexible latches 122 at each corner of the cover engage a notch 124 at each corner of the socket. The cover flexes to engage in a corresponding notch as the cover is pushed down over the socket. In this way, when the cover 120 is pushed down onto the socket, the latches bend outwards and then flex inwards to engage the notches 124. The socket cover can be removed by flexing the outer edges of the cover at outer tabs 126 provided for that purpose. The socket cover also includes a do not touch area 128 which allows a vacuum pick and place tool to grab the socket cover with a vacuum and move the socket from place to place. The do not touch area 128 may also be referred to and function as a circular vacuum tool area or central keep out zone. In the construction of the assembled motherboard a pick and place machine will pick a socket by the cover and place it on to the motherboard in the right location so that solder balls on the bottom of the socket engage the solder paste printed on lands on the motherboard.

In the example of FIG. 2 the socket cover 120 has two different sets of vents on the top surface. A first set of vents 130 surround the circular vacuum tool area 128 in the middle of the surface. These vents are placed at 45 degree intervals around a circle surrounding and defining the keep out zone. Accordingly, there are eight vents evenly distributed around the circular keep out zone. The vents have an angled shape through the thickness of the cover so that air passing through the vent towards the socket will be moving toward the central opening 110 in the socket. The angle may be on the order of 45-60 degrees from the vertical and directed toward the center cavity 110.

The socket cover has additional vents through the horizontal surface. In the illustrated example, the socket cover has a flat central raised area 132 surrounded by a flat outer periphery 134 the raised area has a square shape and the central keep out zone 128 is in the middle of the raised area. The second set of vents is placed on the edges of the raised area. In the illustrated example, these vents 136 are placed three on a side near the vertical wall that connects the raised area to the outer periphery. These vents are also angled similarly to the vents that surround the circular keep out zone. The horizontal outer periphery 134 has no vents.

The vents on the horizontal surfaces serve as inlet vents, as described below. The socket cover also has outlet vents which are placed on vertical surfaces. Between the outer periphery and the raised area is a vertical wall 138 to connect these two horizontal surfaces together. A set of outlet vents 140 is placed on each edge of the vertical wall. Since the raised area has a square outer shape, there are four side walls 138 connecting the square raised area to the square outer periphery.

Figure 3:
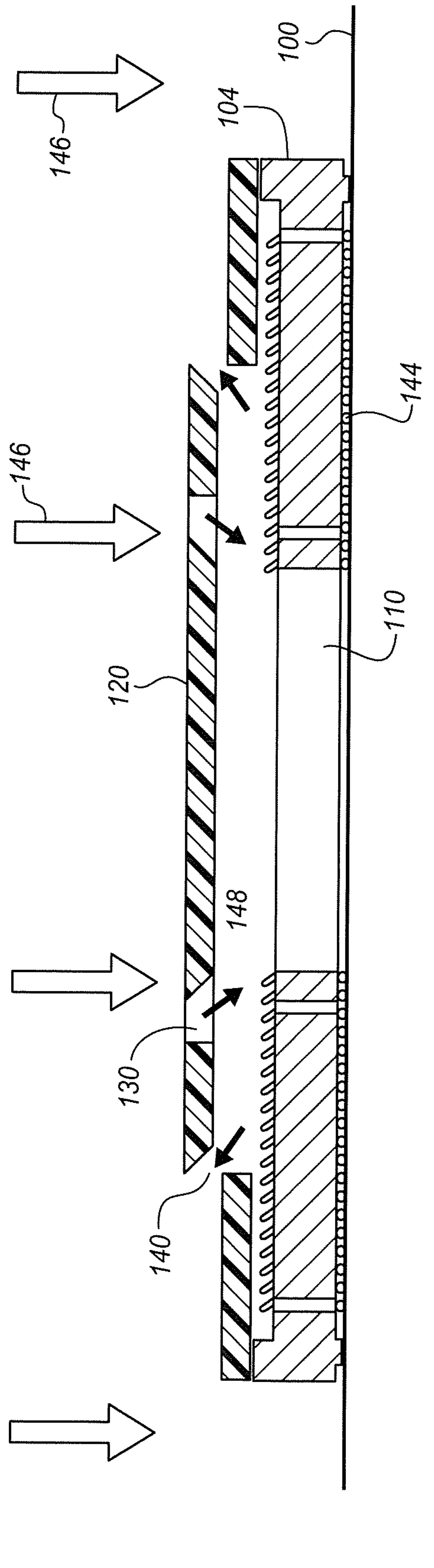
FIG. 3 is a cross-sectional diagram of a socket and a cover being attached to a motherboard in a furnace according to an embodiment of the invention.

FIG. 3 is a cross sectional view of a socket 104 placed on a motherboard 100 with a socket cover 120 in place. The figure diagrams the appearance of the motherboard socket and cover as it passes through the reflow oven. The socket sits on the motherboard 100 on an array of solder balls 144 which are to be melted during the reflow process. In the reflow oven, hot air indicated by arrows 146 is projected downwards onto the motherboard by nozzles in the oven. The hot air passes through the cover as shown by arrows 148 and is pushed toward the central cavity 110 of the socket. This hot air then impinges upon the solder balls in the interior of the socket that are closer to the central opening.

In a similar way hot air 146 directed downward from the nozzles hits the motherboard and impinges on the solder balls 144 on the outer periphery of the socket. The air coming through the cover and the air coming around the outside of the socket reduces the temperature difference between the periphery of the socket and the interior cavity 110 of the socket. While pushing hot air against the socket cover tends to heat the central cavity of the socket and the top layer of the socket, without air flow through the socket cover this heat will not significantly change the temperature of the socket. Accordingly, the outlet vents 140 allow hot air from the nozzles to pass out of the socket cover. This allows a flow of new hot air to be pushed into the socket cover and then released through the vents evening out the temperature of the socket and reducing temperature variations across the socket from its periphery toward its central opening 110.

Figure 4A:
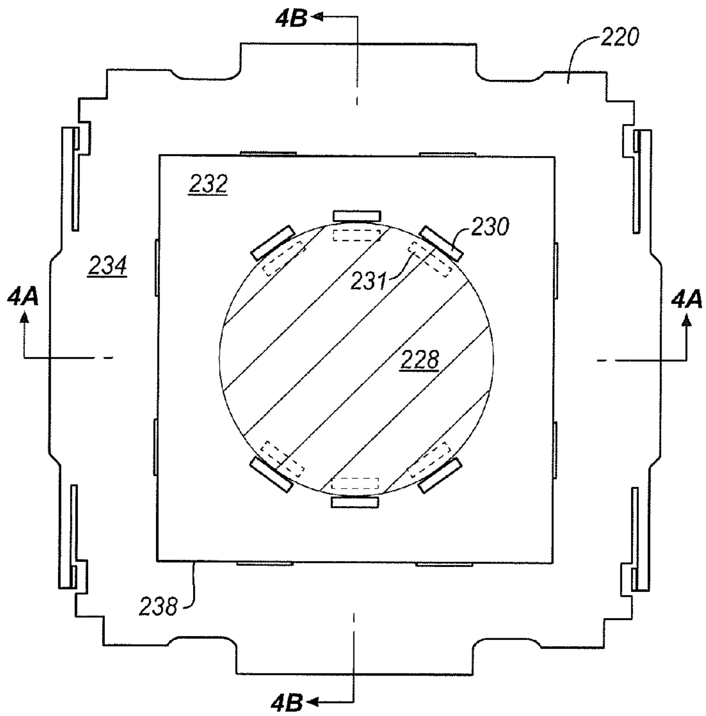
FIG. 4A is a top elevation view of a socket cover according to another embodiment of the invention.

FIG. 4A shows a socket cover 220 with an alternative vent design. In the example of FIG. 4A, the central circular keep out zone 228 of a socket cover 220 includes six pairs of small vents at its very outer edge 230. These vents are placed in pairs at 0, plus 36 degrees and minus 36 degrees about the top and the bottom of a circle that defines the keep out area 228. The vents 230 are placed just outside the keep out zone (KOZ) on the top surface 232 of the cover 220. These inlet vents channel the furnace air just outside the KOZ on the top 244 of the cover to an area just inside the KOZ on the bottom side 246 of the cover. The dashed line opening 231 shows the outlet of the inlet vents on the bottom side of the cover. By limiting the vents to six, the operation of the vacuum tool is not impeded, yet the inner circle of vents may be placed closer to the center of the socket. The circular slot pattern is not perfectly symmetric. One set of slots is closer to 12 o'clock and the other is closer to 6 o'clock to maximize the air flow into the center cavity 110. The clustering of vents may be rotated to other positions, such as 2 o'clock and 8 o'clock depending on the demands of the particular implementation.

Figure 4B:
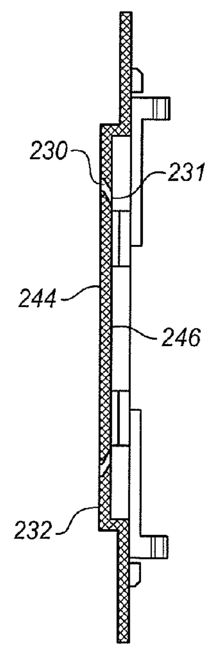
FIG. 4B is a side cross-sectional view along line 4B-4B of the socket cover of FIG. 4A according to an embodiment of the invention.

As shown in FIG. 4B, the six vents are formed with angled channels in order to push the downward flowing air from the nozzles of the reflow oven toward the center of the socket 104. FIG. 4B shows the raised central square area 232 of the socket cover with a top surface 244 directed away from the socket and toward the nozzles of the reflow oven and a bottom surface 246 which faces the socket when the socket cover 220 is installed on to a socket. As shown in FIG. 4B, the vents 230 in the horizontal surface of the cover are formed at an angle facing toward the center of the socket. The outlets 231 of these vents therefore direct air toward the center of the socket and for a socket such as that of FIG. 2 toward the central opening 110.

Figure 4C:
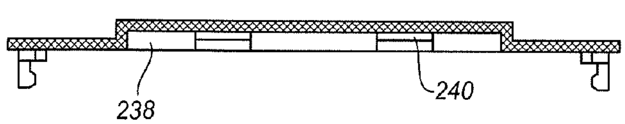
FIG. 4C is a side cross-sectional view of the socket cover of FIG. 4A according to an embodiment of the invention.

FIG. 4C is a side elevation view of the vertical side walls 238 of the socket cover and the vents 240 that are placed on the side walls 238 of the socket cover. These side walls are between the central raised area 232 of the socket cover and the outer periphery 234 of the socket cover. In the example of FIG. 4C there are two vents 240, one at each end of the vertical side walls of the socket cover. These vents extend through the vertical wall and serve as exhaust vents as shown for example in FIG. 3.

While two variations of horizontal and vertical vents on the socket cover are shown, many other variations are possible. In the two examples, the vents in the horizontal surface are brought as close to the middle of the socket cover as possible without interfering with the keep out zone 228 in the center of the socket cover. This is in order to avoid interfering with the operation of the vacuum tool head of the pick and place machine for which the socket cover is designed. The vents may be arranged in a circular pattern as shown or in a rectangular pattern as shown for example in FIG. 2 or both.

As shown, the inlet top vents have a larger total air flow channel area compared to the outlet side vents. This is done in the examples by having more horizontal surface vents than vertical surface vents. The difference in area promotes impinging hot air intake on the topside and radial outward air flow and exhaust on the four sides. At the same time, the socket is protected and the air flow is controlled to prevent premature flux degradation.

Controlling the air flow around a socket and socket cover within the SMT reflow oven allows an LGA socket geometry to be designed that optimizes air flow efficiency. As the motherboard travels through the SMT reflow oven, heated air is delivered to the motherboard by groups of nozzles arranged vertically downward. The nozzles each generate a discrete, higher pressure air flow zone. The zones are at different temperatures as the board advances through the oven. As the heated air impinges on the board and the components, heat is transferred to them. The illustrated vents on the socket cover, transfer heat across the socket. The vents arranged in a circle, on the horizontal plane on the top side of the socket cover acting predominantly as air inlet vents. The capture the vertical air flow from the nozzles and direct it towards the "cooler" center area of the socket.

The vents located on the vertical side walls of the socket cover are shielded from the higher pressure vertical air flow from the nozzles. This creates a pressure differential within the socket in which there is a positive pressure into the cover from the horizontal vents. As a result, the vertical vents act predominantly as exhaust vents allowing the air to circulate under the cover and then exit the socket through the exhaust vents.

Controlling the air flow through the socket also increases the rate of heat transfer. The area ratio between the "inlet" and "exhaust" vents also affects the air flow. The area ratio is selected to direct the air flow to cause more uniform temperatures within the socket.

The controlled air flow provides more even and uniform heating through the reflow oven. This allows the solder balls to collapse more uniformly and allows for better alloy wetting because the solder balls are being heated at closer to the same rate from the center to the edge of the socket. The more even distribution of heat further reduces warping in the substrate of the socket that might be caused by temperature variations in the substrate.

By making the heat transfer more efficient, and uniform, the SMT reflow oven process yield is improved. Manufacturing throughput is also improved because the more efficient heat transfer allows the solder reflow to happen in less time. Another effect of more uniform solder joint formation is a more reliable product, with a larger mean time between failures. The SMT reflow oven process is also less prone to failure, meaning that the timing of the process does not need to be as precise resulting in easier and faster socket attachment. The new socket covers may be used for the manufacture of boards for desktop and server computers and for products ranging from net top, home theater, and personal computers to rack mounted servers used in Data Centers.

Figure 5:
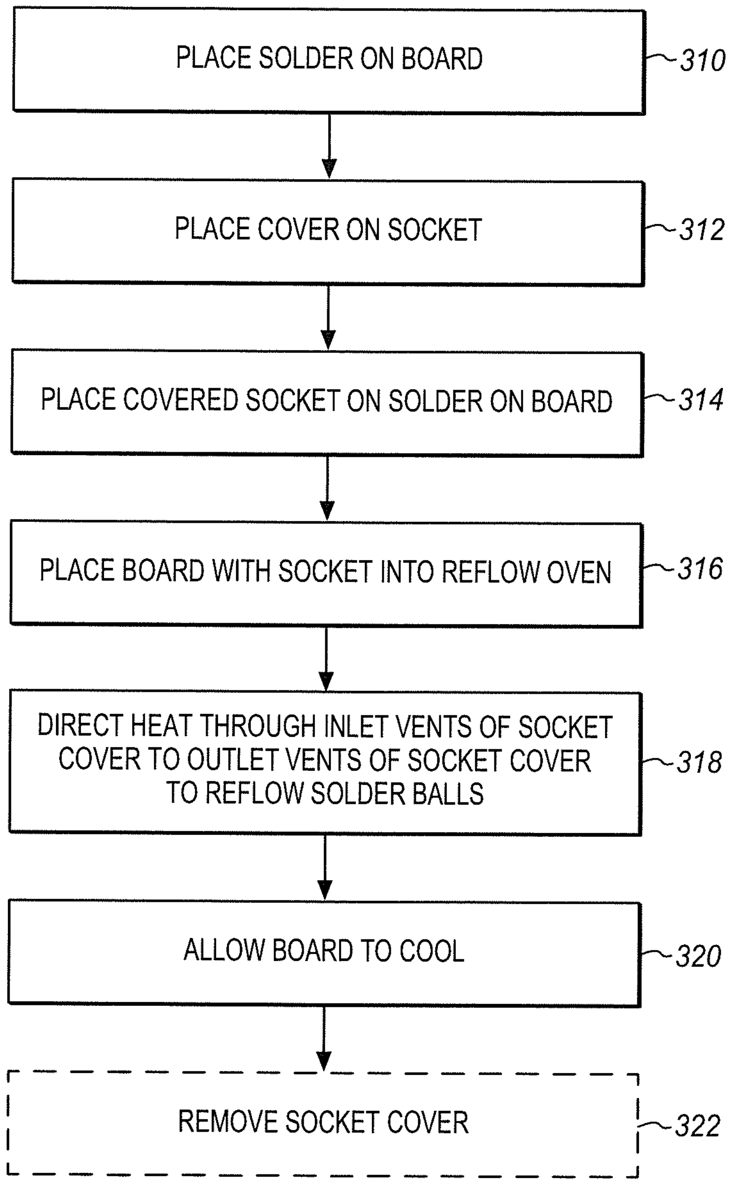
FIG. 5 is process flow diagram of attaching a socket to a printed circuit board according to an embodiment of the invention.

FIG. 5 is a flow diagram of a process for attaching a socket to a printed circuit board using a socket cover. At 310, solder paste is placed on a contact lands pattern on a printed circuit board. This is typically done using solder paste and a printing method. At 312, a cover is placed on a socket. This may be done before or after the solder paste operation. Frequently the covers come pre-attached to the socket from the manufacturer so this operation is performed long before the paste is applied. At 314, the socket, with solder balls pre-attached underneath the socket, is placed on the solder paste on the contact lands of the printed circuit board. Many other components may also be placed on the printed circuit board. Some of these other components may be covered sockets, while other may be discrete components, input/output connectors, surface mount packages and other types of parts. There may be more than one socket in the case of a computer with multiple processors or for a computer in which other components are also socketed.

At 316, the printed circuit board with the socket and the cover are placed into a solder reflow furnace to solder the socket to the printed circuit board. The assembly will pass through the oven experiencing a slow increase and decrease in temperature during the processing in the oven. At 318, heating nozzles inside the SMT reflow or other type of oven direct heat at the socket cover. The vents in the cover will allow that heat to flow through the cover to the socket and, if there is an opening in the socket, to the printed circuit board. Typically the heat is in the form of hot air, however, other gases may be used, depending on the type of product being produced and the oven design. The hot air or other heat carrier is also exhausted from between the socket and the cover through outlet vents in the cover. This allows the temperature of the air inside the compartment between the socket and the cover to change as the oven air temperature changes. The socket will be heated and cooled with the rest of the components.

At 320, the assembly is allowed to cool inside and outside of the oven. The solder sets and solidifies and the socket is attached to the printed circuit board. Finally at 322 the socket cover is removed. The socket cover may be removed and replaced with a different cover that is designed for a different purpose, or it may be removed to allow a packaged die to be installed into the socket.

It is to be appreciated that a lesser or more equipped socket cover, socket, and assembly system than the examples described above may be preferred for certain implementations. Therefore, the configuration of the exemplary systems and components may vary from implementation to implementation depending upon numerous factors, such as price constraints, performance requirements, technological improvements, or other circumstances.

Embodiments may be adapted to be used with a variety of different packaged component and socket types using various types of motherboards for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that comprises a cover for a socket that is to be soldered to a printed circuit board, the socket having a plurality of connections to be soldered to the printed circuit board and a plurality of connections to contact a die that will be carried by the socket. The cover includes a top surface to cover the die contacts of the socket, and side walls surrounding the top surface and extending toward the socket to separate the top surface from the die contacts. The top surface has a plurality of inlet vents, and the side walls have a plurality of outlet vents.

In further embodiments the socket cover may have one or more of any of the following features. The inlet vents are arrayed around a central circle. All of the outlet vents are further from the center of the top surface than any of the inlet vents. The side walls are perpendicular to the top surface and the outlet vents are formed as openings in the perpendicular surface. The outlet vents direct flow away from the center of the cover. The inlet vents are configured to receive heated gas from nozzles of a solder reflow furnace. The outlet vents are configured to direct heated gas from the cover and away from the nozzles of the solder reflow furnace. The inlet vents are larger than the outlet vents. The total added area of inlet vents being larger than the total added area of outlet vents. Any one or more of the above embodiments may include an outer periphery extending from the side walls, the outer periphery contacting the socket to attach the cover to the socket, so that the outlet vents are spaced from the outer edges of the socket by the cover periphery.

In another embodiment the socket cover comprises a horizontal surface having inlet vents to receive a heated gas directed to the socket from a heat source of the solder reflow furnace; and a vertical surface having outlet vents to direct heated gas from the socket away from the socket and away from the heat source. The socket cover may include one or more of the following additional features. The inlet vents direct the received heated gas to the center of the socket and the outlet vents direct the received heated gas away from the center of the socket. The inlet vents are arranged in a circle about the center of the socket. The outlet vents are arranged offset a distance from the outer edges of the socket. The vertical surface is coupled to a horizontal periphery that supports the cover by physical contact with the outer edge of the socket.

In another embodiment a method includes placing solder paste on socket contacts of a printed circuit board. placing solder balls of the socket on the solder paste on the socket contacts of the printed circuit board, placing the printed circuit board with the socket and the cover into a solder reflow furnace to solder the socket to the printed circuit board, directing a heated gas in the solder reflow oven to the cover, conducting the heated gas through central inlet vents of the cover to a central area of the socket to heat the socket, and cooling the socket and the cover to set the solder and attach the socket to the printed circuit board.

In further embodiments the method may also include exhausting the heated gas from between the cover and the socket. Exhausting may include exhausting through outer outlet vents of the cover away from the central area of the socket.

What is claimed is:

1. A cover for a socket for use when the socket is soldered to a printed circuit board, the socket having a plurality of connections to be soldered to the printed circuit board and a plurality of connections to contact a die that will be carried by the socket, the cover comprising:

a top surface to cover the die contacts of the socket;

an outer periphery surrounding the top surface and further covering the die contacts of the socket;

side walls surrounding the top surface between the top surface and the outer periphery and connecting the top surface and the outer periphery and extending toward the socket to separate the top surface further from the die, contacts than the outer periphery;

a plurality of inlet vents, wherein the inlet vents are arrayed around a central circle in the top surface; and a plurality of outlet vents in the side walls.

2. The cover of claim 1, wherein all of the outlet vents are further from the center of the top surface than any of the inlet vents.

3. The cover of claim 1, wherein the side walls are perpendicular to the top surface and the outlet vents are formed as openings in the perpendicular surface.

4. The cover of claim 3, wherein the outlet vents direct flow away from the center of the cover.

5. The cover of claim 1, wherein the inlet vents are configured to receive heated gas from nozzles of a solder reflow furnace.

6. The cover of claim 5, wherein the outlet vents are configured to direct heated gas from the cover and away from the nozzles of the solder reflow furnace.

7. The cover of claim 1, wherein the inlet vents are larger than the outlet vents.

8. The cover of claim 1, wherein the total area of the inlet vents is larger than the total area of the outlet vents.

9. The cover of claim 1, wherein the top surface is horizontal and wherein the outer periphery is horizontal and contacts the socket to attach the cover to the socket, the socket having outer edges outside of the connections, so that the outlet vents in the top surface are spaced from the outer edges of the socket by the cover's outer cover periphery.

10. A socket cover for use in attaching a socket to a printed circuit board in a solder reflow furnace, the socket cover having a plurality of connections to be soldered to the printed circuit board and a plurality of connections to contact a die that will be carried by the socket, the socket cover comprising:

- a horizontal top surface having inlet vents to receive a heated gas directed to the socket from a heat source of the solder reflow furnace, wherein the inlet vents are arranged in a circle about the center of the socket;
- a horizontal outer periphery surrounding the top surface; and
- a vertical surface between the top surface and the outer periphery having outlet vents to direct heated gas from the socket away from the socket and away from the heat source.

11. The cover of claim 10, wherein the inlet vents direct the received heated gas to the center of the socket and the outlet vents direct the received heated gas away from the center of the socket.

12. The cover of claim 10, wherein the outlet vents are arranged on the vertical surface of the cover offset from the outer edges of the socket by a specific distance.

13. The cover of claim 10, wherein the vertical surface is coupled to the horizontal outer periphery and the horizontal outer periphery supports the cover by physical contact with the outer edge of the socket.

14. A method comprising:

- placing solder paste on socket contacts of a printed circuit board;
- placing a socket with a cover attached to the socket on the socket contacts of the printed circuit board, the socket having a plurality of connections to be soldered to the printed circuit board and a plurality of connections to contact a die that will be carried by the socket;
- placing the printed circuit board with the socket and the cover into a solder reflow furnace to solder the socket to the printed circuit board; and
- cooling the socket and the cover to set the solder and attach the socket to the printed circuit board, the cover having:
- a top surface to cover the die contacts of the socket;
- an outer periphery surrounding the top surface and further covering the die contacts of the socket;
- side walls surrounding the top surface between the top surface and the outer periphery and connecting the top surface and the outer periphery and extending toward the socket to separate the top surface further from the die contacts than the outer periphery;
- a plurality of inlet vents in the top surface, wherein the inlet vents are arrayed around a central circle; and
- a plurality of outlet vents in the side walls.

15. The method of claim 9, further comprising

- directing a heated gas in the solder reflow oven to the cover; and
- conducting the heated gas through the inlet vents of the cover to a central area of the socket to heat the socket.

16. The method of claim 14, further comprising exhausting the heated gas from between the cover and the socket through the outlet vents by directing heated gas to the inlet vents.

17. The method of claim 16, wherein exhausting comprises exhausting through the outlet vents of the cover away from the central area of the socket.

* * * * *

UNITED STATES PATENT AND TRADEMARK OFFICE

CERTIFICATE OF CORRECTION

PATENT NO. : 8,622,278 B1
APPLICATION NO. : 13/539246
DATED : January 7, 2014
INVENTOR(S) : Alvarez et al.

It is certified that error appears in the above-identified patent and that said Letters Patent is hereby corrected as shown below:

In the Claims

In column 8, at line 62 delete, "vents, wherein the inlet vents are arrayed around a central circle in the top surface;" and insert --vents in the top surface, wherein the inlet vents are arrayed around a central circle;--.

Signed and Sealed this
Eleventh Day of November, 2014

Michelle K. Lee
*Deputy Director of the United States Patent and Trademark Office*